(12) United States Patent
Ramaraju et al.

(10) Patent No.: US 7,295,487 B2
(45) Date of Patent: Nov. 13, 2007

(54) STORAGE CIRCUIT AND METHOD THEREFOR

(75) Inventors: Ravindraraj Ramaraju, Round Rock, TX (US); Prashant U. Kenkare, Austin, TX (US); Jeremiah T. C. Palmer, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 121 days.

(21) Appl. No.: 11/132,457

(22) Filed: May 19, 2005

(65) Prior Publication Data
US 2006/0262633 A1 Nov. 23, 2006

(51) Int. Cl.
*G11C 8/00* (2006.01)
(52) U.S. Cl. .................. 365/230.05; 365/189.04; 365/190; 365/63
(58) Field of Classification Search ........... 365/230.05, 365/185.01, 63, 189.04
See application file for complete search history.

(56) References Cited

U.S. PATENT DOCUMENTS 5,854,761 A 12/1998 Patel et al.
6,282,143 B1 8/2001 Zhang et al.
6,804,143 B1 * 10/2004 Hobson ................ 365/154

OTHER PUBLICATIONS

Morimura "A Shared-Bitline SRAM Cell Architecture for 1-V Ultra Low-Power Word-Bit Configurable Macrocells" NTT Lifestyle and Environmental Technology Laboratories; 1999; Kanagawa, Japan.

* cited by examiner

*Primary Examiner*—Richard T. Elms
*Assistant Examiner*—Pho M. Luu
(74) *Attorney, Agent, or Firm*—Susan C. Hill; Robert L. King

(57) ABSTRACT

Storage circuits (180-183 and 280-281) may be used for low power operation while allowing fast read access. In one embodiment (e.g. circuit 100), shared complementary write bit lines (101, 102), separate read bit lines (103-106), a shared read word line (107), and separate write word lines (108-111) are used. In an alternate embodiment (e.g. circuit 200), shared complementary write bit lines (201, 202), a shared read bit line (203), separate read word lines (206-207), and separate write word lines (208-209) are used. The storage circuit may be used in a variety of contexts, such as, for example, a register file (17), a branch unit (15), an SRAM (19), other modules (20), a cache (18), a buffer (21), and/or a memory (14).

13 Claims, 5 Drawing Sheets

FIG. 3

STORAGE CIRCUIT AND METHOD THEREFOR

FIELD OF THE INVENTION

The present invention relates to integrated circuits, and more particularly, to a storage circuit in an integrated circuit.

RELATED ART

Lower power consumption has been gaining importance in data processing systems, due, for example, to wide spread use of portable and handheld applications. Many data processing systems today use a smaller, faster, and more efficient memory, sometimes referred to as a cache, located on the integrated circuit to reduce the number of accesses to memory (such as main memory or other internal or external memories). Accesses to cache generally consume less power and result in reduced latencies as compared to accesses to other internal or external memories. Therefore, it is desirable to store those items which will subsequently be requested again in the faster, more efficient cache in order to reduce power and increase performance.

Also to reduce power consumption and to allow the cache to operate as fast as possible, a need exists for an improved storage circuit which may be used in the context of a cache, and which may also or alternately have applicability to a variety of other applications which utilize a storage circuit. One such application for a storage circuit having low power consumption and fast read access is context or thread switching. Many other applications may utilize a storage circuit having low power consumption and fast read access.

BRIEF DESCRIPTION OF THE DRAWINGS

The present invention is illustrated by way of example and not limited by the accompanying figures, in which like references indicate similar elements, and in which:

FIG. 3 illustrates, in block diagram form, a portion of the tag array of FIG. 2 in accordance with one embodiment of the present invention;

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, a plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Figure 1:
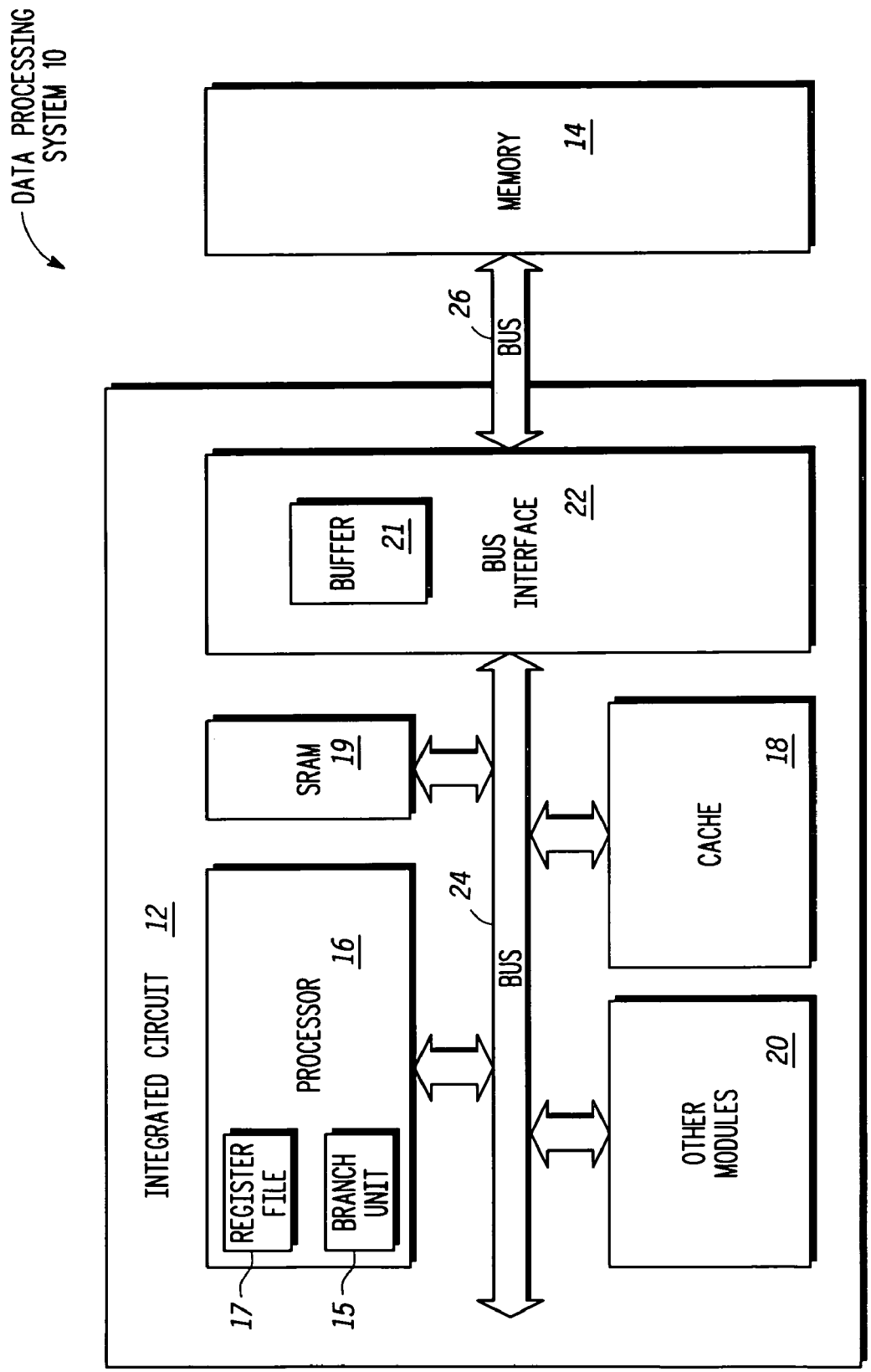
FIG. 1 illustrates, in block diagram form, a data processing system in accordance with one embodiment of the present invention.

Referring to FIG. 1, an embodiment of a data processing system 10 is illustrated. Data processing system 10 includes an integrated circuit 12, and an external memory 14. Integrated circuit 12 includes a processor 16, a cache memory 18, a static random access memory (SRAM) 19, a bus interface 22, and other modules 20. Integrated circuit 12 also includes bus 24 and bus 26. Bus 24 couples processor 16, cache 18, SRAM 19, bus interface 22, and other modules 20. Bus 26 couples bus interface 22 to external memory 14. While a specific exemplary embodiment of data processing system 10 has been disclosed, it is contemplated that various configurations and alternative embodiments of such a processing system could be implemented.

For example, while the cache 18 has been shown as part of integrated circuit 12, cache 18 could alternatively be disposed outside of the integrated circuit 12, such as, for example, within external memory 14. Also, note that integrated circuit 12 may include any number of processors, such as in a multi-processor data processing system, and other modules 20 may include any other peripheral devices such as, for example, other masters, slaves, or memories. Also, data processing system 10 may include any number of integrated circuits such that different portions of data processing system 10 may be located on different semiconductor substrates, or, alternatively, data processing system 10 may be fabricated on the same substrate. Also, external memory 14 may be located on the same semiconductor substrate as integrated circuit 12, or may be located on a separate substrate.

In one embodiment, processor 16 has a register file 17 and a branch unit 15. Alternate embodiments may locate a register file 17 in any portion of data processing system 10. In one embodiment, branch unit 15 may be used to perform branch prediction for processor 16. A variety of methods for performing branch prediction are well known in the art. In one embodiment, bus interface 22 has a buffer 21. Alternate embodiments may locate a buffer 21 in any portion of data processing system 10. Data processing system 10 will only be discussed to the extent necessary to understand the embodiments of the present invention, as will be described below in reference to FIGS. 2-5. The remaining functionality is as known in the art and thus may be implemented in a variety of different ways known in the art. Note that all or any portions of data processing system 10 may be implemented together on a single integrated circuit.

Figure 2:
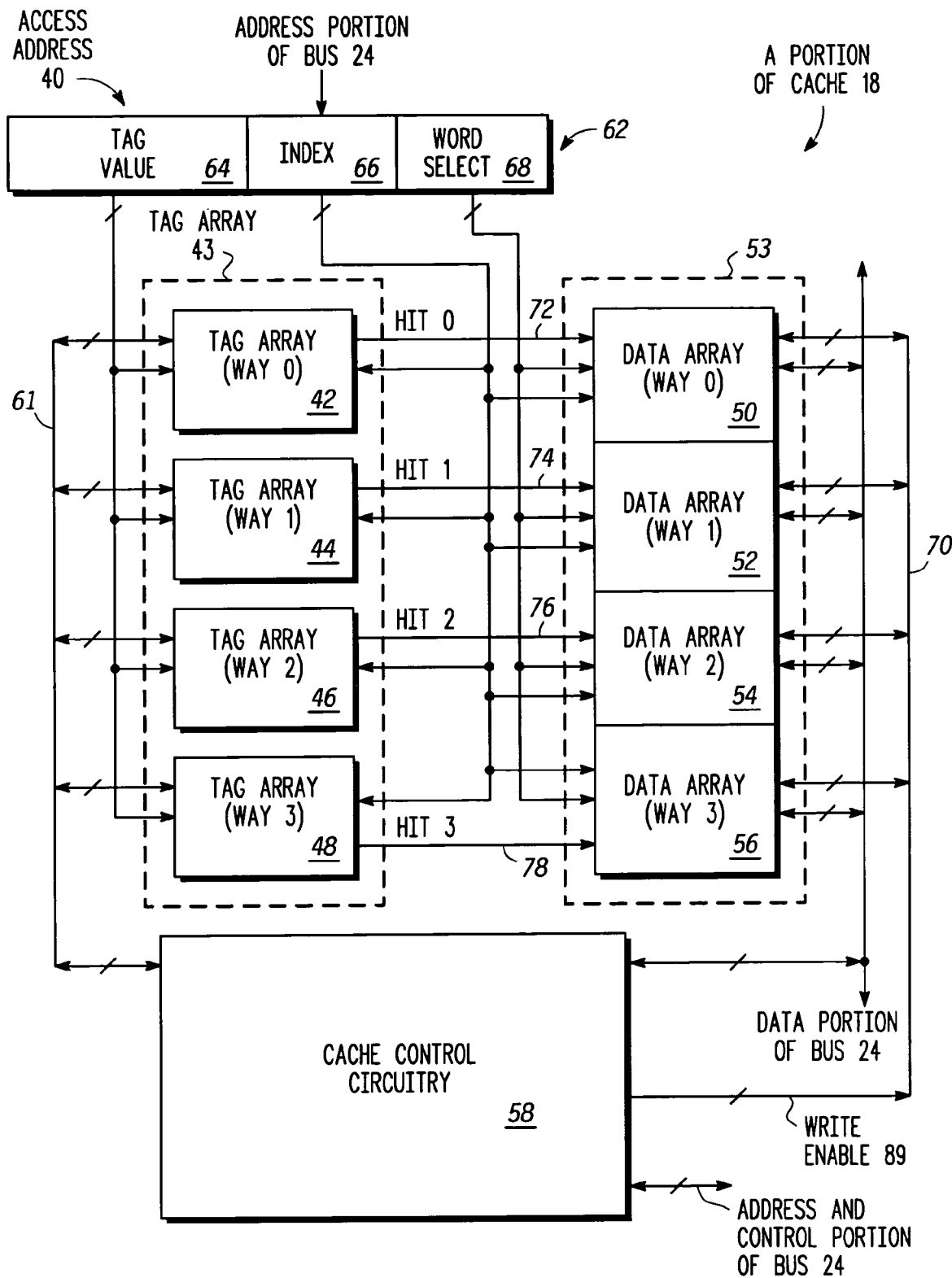
FIG. 2 illustrates, in block diagram form, a portion of the cache of FIG. 1, in accordance with one embodiment of the present invention.

Referring to FIG. 2, a particular embodiment of a portion of the cache 18 is disclosed. The portion of the cache 18 includes a register 62, tag memory array for multiple ways 42-48, data memory array for multiple ways 50-56, and cache control circuitry 58. Access address 40 is received from an address portion of bus 24 and has a tag value portion 64, an index portion 66, and a word select portion 68. For example, for a read access, access address 40 corresponds to the address of the requested information (e.g. data or instructions). In the illustrated embodiment, access address 40, when received, is stored within register 62. Tag portion 64 of access address 40 includes tag value data that is provided to the multi-way tag array 43. In the illustrated embodiment, tag array 43 has tag array 42 for way0, tag array 44 for way1, tag array 46 for way2, and tag array 48 for way3. Data from the index portion 66 is provided to both the multi-way tag array 43 and to the multi-way data array 53 and is used to provide an index into the tag arrays (42, 44, 46, 48) and data arrays (50, 52, 54, 56). For example, in one embodiment, index portion 66 includes a set indicator to select one of a predetermined number of sets within the tag and data portions of each way. Data from the word select portion 68 is provided to the multi-way data array 50-56 such that data within a data array, such as data array (way0) 50, is indicated by both index portion 66 and word select portion 68. That is, index portion 66 may identify one entry of data array (way0) 50, and word select 68 then identifies a portion of that entry. The multi-way data array is also coupled to a bidirectional data portion of the bus 24 to receive and provide data from and to bus 24.

Each portion of tag array 43, such as tag array (way0) 42 provides a hit signal to a corresponding data array, such as data array (way0) 50, based on a comparison between tag value 64 and data within tag array (way0) 42 located with respect to index value 66. For example, in operation, tag portion 64 is compared with a value retrieved from the tag array (way 0) 42 via index portion 66 to provide hit signal 72. If the compared values result in a match, then hit signal 72 is asserted to indicate a hit. Data array (way 0) 50 includes a plurality of data blocks and is addressed by both the index value 66 and the word select value 68, and, in response to the hit, the addressed data item is output from the data array (way 0) 50 to the data portion of bus 24. If, however, the compared values do not result in a match, then hit signal 72 is not asserted, indicating a miss in that way of cache 18. If there is no match between tag value 64 and any of the tags in tag arrays 42-48, then none of hit signals 72-78 are asserted, indicating that access address 40 resulted in a miss in cache 18.

Note that FIG. 2 illustrates only one example of a portion of cache 18. However, note that in alternate embodiments, register 62, tag arrays 42-48, and data arrays 50-56 may be implemented in a variety of different ways, as known in the art, to achieve the desired functionality. Cache control circuitry 58 may provide the control signals that are used to operate cache 18.

Figure 3:
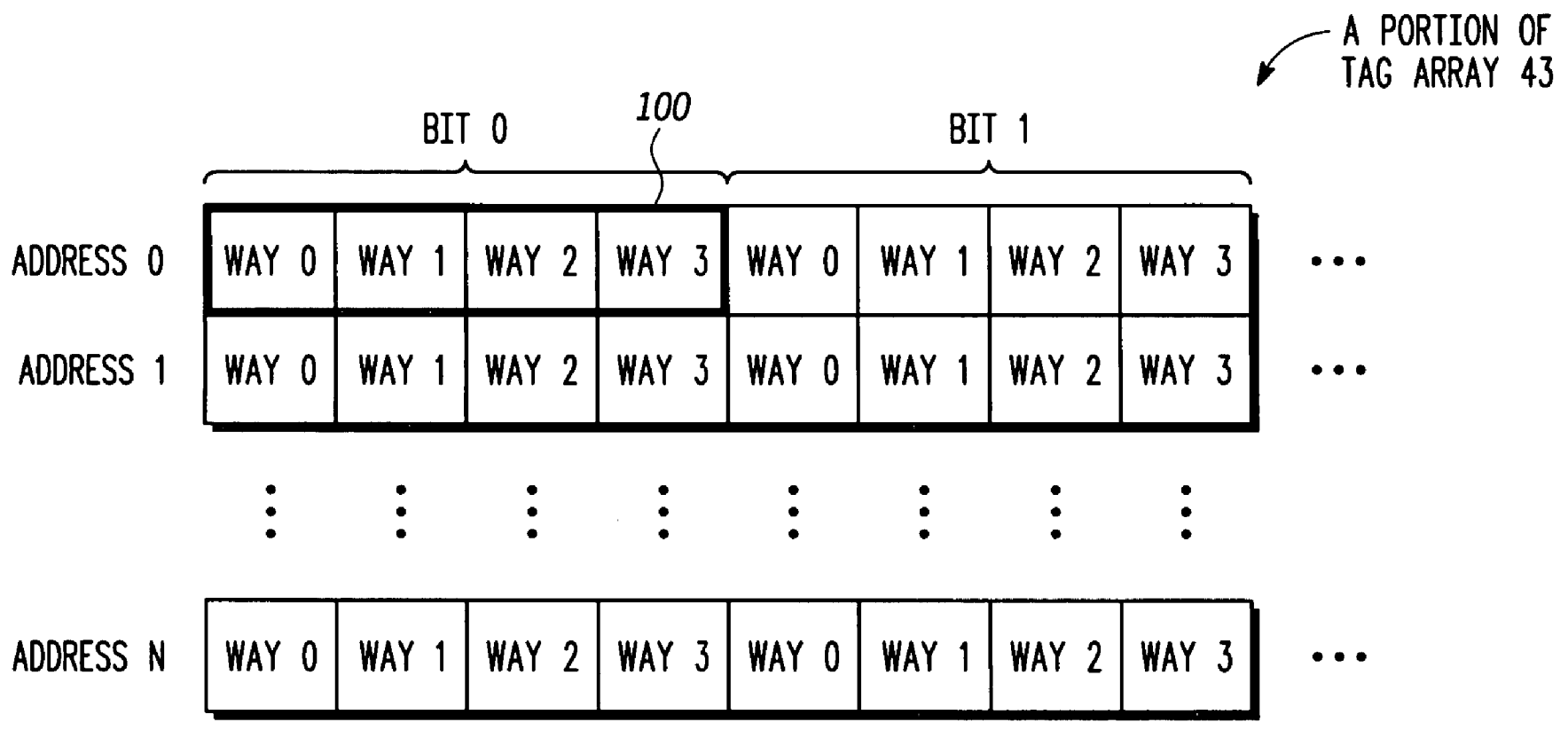

FIG. 3 illustrates one embodiment of a portion of the tag array 43 of FIG. 2. In the illustrated embodiment, bit0 and bit1 for address0 are illustrated. Alternate embodiments may have any desired number of bits which correspond to each address (such as, for example, address0 may correspond to 8-bits, 9-bits, 16-bits, 32-bits, 64-bits, etc.). Note that for the illustrated embodiment, each bit (e.g. bit0) at a predetermined address (e.g. address0) has a separate portion for each way (e.g. way0, way1, way2, way3). Note that tag array 43 may also have any desired number of addresses (e.g. address0 to addressN, where N is an integer number). In the illustrated embodiment, bit0 for address0 comprises a circuit 100 which includes a circuit for way0, a circuit for way1, a circuit for way 2, and a circuit for way 3.

Those skilled in the art will recognize that FIG. 3 is only showing the portion of the tag array 43 that includes bitcells. Each bitcell includes storage element(s) and transistors for reading and writing the storage element(s) (see FIG. 4). The portions of tag array 43 which are not illustrated in FIG. 3 may be implemented in any desired manner, including any appropriate prior art manner. For example, in some embodiments the tag array 43 will likely include input latches for address, control, and write data. In addition, there are likely to be address decoders, word line drivers, and column circuitry. The column circuitry could encompass column multiplexers, sense-amplifiers or data inverters, output drivers, and output latches, all of which may be implemented in any desired manner, including any appropriate prior art manner. As used herein, the term bitcell is one type of storage circuit.

In addition, those of ordinary skill in the art will recognize that only one tag way is likely to be written at a given time. More generally, it is very common that only a portion of bitcells for a given entry (word line) needs to be written. The remainder of the bitcells should then hold their original state. The commonly practiced prior art accomplishes this functionality by using precharged write bit line pairs (bit line and bit line bar) for all bitcells associated with a word line. Bitcells that do not need to be updated will have bit line and bit line bar to remain precharged at a value substantially close to a second power supply voltage (e.g. power or VDD). Bitcells that need to be updated will have complimentary values for bit line and bit line bar (closer to VDD vs. closer to ground, or vice versa).

The approach described in the preceding paragraph is commonly used by those skilled in the art. However, it has inherent weaknesses for applications requiring low power consumption and low voltage operation. Specifically, it should be noted that bitcells not needing to be updated still have their select transistor(s) in the conducting state. As a result, the internal storage nodes of the bitcell are exposed to the bit line and bit line bar signals which are precharged close to VDD. As a result, there will be current flowing from the bit line (or bit line bar) that is associated with the "logic 0" side of the bitcell. This is a "dummy read" operation that partially discharges the bit line (or bit line bar). Eventually the partially discharged bit line (or bit line bar) needs to be replenished during the precharge operation. Hence, this is wasted power.

Aside from the wasted power, there is another weakness that is inherent to this approach. Specifically, the "dummy read" requires the internal storage nodes of the bitcells to be exposed to the precharged bit line and bit line bar. In turn, this leads to the possibility of unintentionally changing the state of the bitcell. To guard against this, the bitcell transistors have to be sized in a manner that improves stability during the dummy read. The side-effect of this is that this makes the bitcell more difficult to write at lower voltages.

Figure 4:
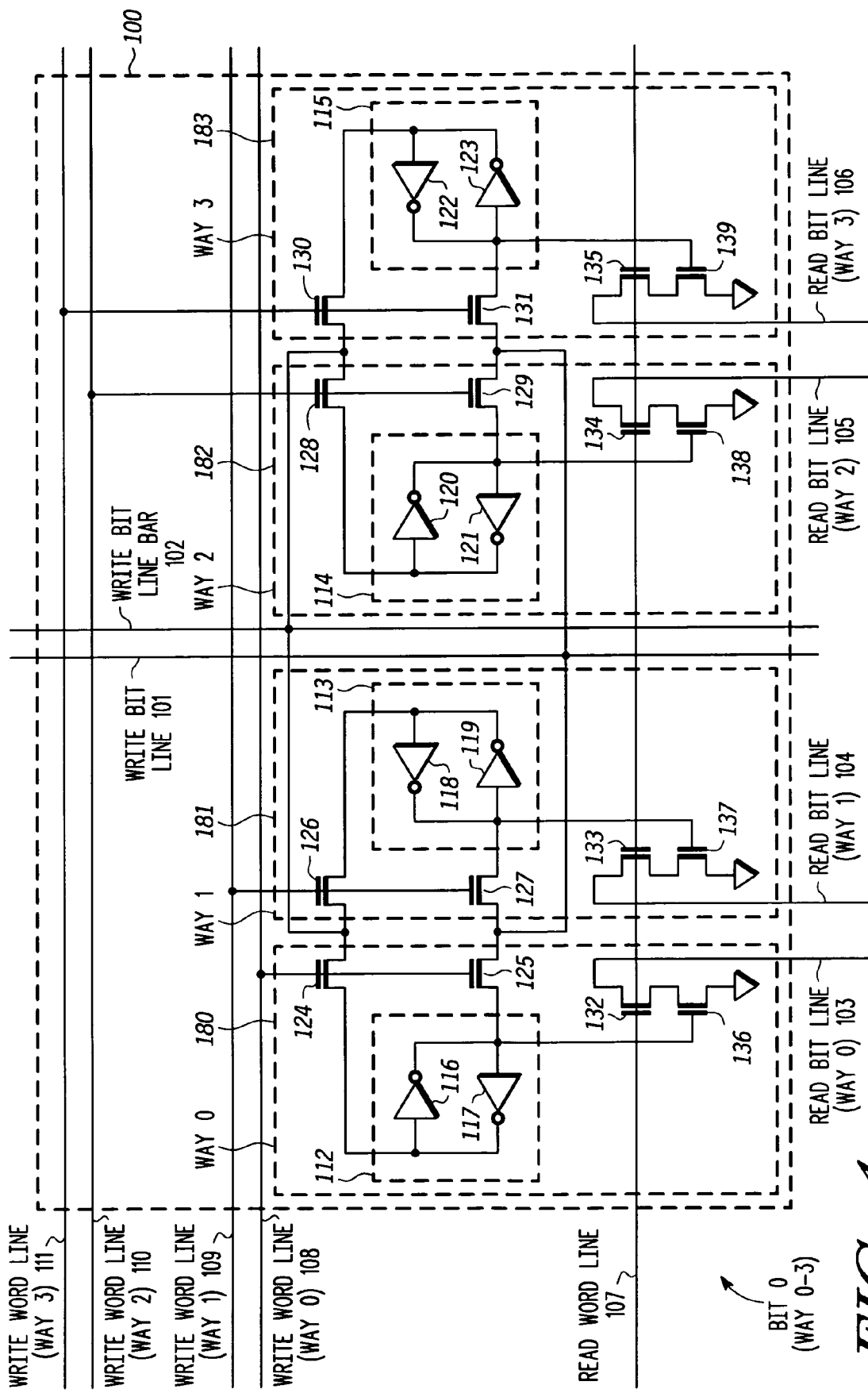
FIG. 4 illustrates, in schematic diagram form, bit0 of address0 of FIG. 3 in accordance with one embodiment of the present invention.

The proposed approach illustrated in FIG. 4 eliminates the "dummy read" by using a separate write word line for each tag way that is to be written. The separate write word lines do not necessarily increase bitcell area because this is generally dominated by transistor layout rules as opposed to metal layout rules. In addition, the proposed approach in FIG. 4 consolidates all the write metal bit lines for the four ways into one shared metal bit line (and/or bit line bar). The advantages of this will be discussed in the description associated with FIG. 4.

FIG. 4 illustrates one embodiment of circuit 100 (bit0 of address0 for ways0-3) of FIG. 3. The storage cell 112 for way0 comprises cross-coupled inverters 116 and 117. Storage cell 112 has a first terminal coupled to a first current electrode of transistor 124 and a second terminal coupled to a first current electrode of transistor 125. The control electrode of transistors 124 and 125 are both coupled to write word line (way0) 108. The second terminal of storage cell 112 is coupled to a control electrode of transistor 136. A first current electrode of transistor 136 is coupled to a first power supply voltage. A second current electrode of transistor 136 is coupled to a first current electrode of transistor 132. Read word line 107 is coupled to a control electrode of transistor 132. A second current electrode of transistor 132 is coupled to read bit line (way0) 103.

The storage cell 113 for way1 comprises cross-coupled inverters 118 and 119. Storage cell 113 has a first terminal coupled to a first current electrode of transistor 126 and a second terminal coupled to a first current electrode of transistor 127. The control electrode of transistors 126 and 127 are both coupled to write word line (way1) 109. A second current electrode of transistor 126 is coupled to a second current electrode of transistor 124 and to write bit line bar 102. Note that the term "bar" is used to denote a complementary signal (e.g. write bit line bar 102 is complementary to write bit line 101). A second current electrode of transistor 127 is coupled to a second current electrode of transistor 125 and to write bit line 101. The second terminal of storage cell 113 is coupled to a control electrode of transistor 137. A first current electrode of transistor 137 is coupled to the first power supply voltage. A second current electrode of transistor 137 is coupled to a first current electrode of transistor 133. Read word line 107 is coupled to a control electrode of transistor 133. A second current electrode of transistor 133 is coupled to read bit line (way1) 104. Circuitry 180 is used for way0, and circuitry 181 is used for way1.

The storage cell 114 for way2 comprises cross-coupled inverters 120 and 121. Storage cell 114 has a first terminal coupled to a first current electrode of transistor 128 and a second terminal coupled to a first current electrode of transistor 129. The control electrode of transistors 128 and 129 are both coupled to write word line (way2) 110. The second terminal of storage cell 114 is coupled to a control electrode of transistor 138. A first current electrode of transistor 138 is coupled to the first power supply voltage. A second current electrode of transistor 138 is coupled to a first current electrode of transistor 134. Read word line 107 is coupled to a control electrode of transistor 134. A second current electrode of transistor 134 is coupled to read bit line (way2) 105.

The storage cell 115 for way3 comprises cross-coupled inverters 122 and 123. Storage cell 115 has a first terminal coupled to a first current electrode of transistor 130 and a second terminal coupled to a first current electrode of transistor 131. The control electrode of transistors 130 and 131 are both coupled to write word line (way3) 111. A second current electrode of transistor 130 is coupled to a second current electrode of transistor 128 and to write bit line bar 102. A second current electrode of transistor 131 is coupled to a second current electrode of transistor 129 and to write bit line 101. The second terminal of storage cell 115 is coupled to a control electrode of transistor 139. A first current electrode of transistor 139 is coupled to the first power supply voltage. A second current electrode of transistor 139 is coupled to a first current electrode of transistor 135. Read word line 107 is coupled to a control electrode of transistor 135. A second current electrode of transistor 135 is coupled to read bit line (way3) 106. Circuitry 182 is used for way2, and circuitry 183 is used for way3. The transistors illustrated in FIG. 4 are all n-channel field effect transistors. Alternate embodiments may instead use p-channel field effect transistors or a combination of n-channel and p-channel transistors coupled appropriately within circuit 100.

For some embodiments of circuit 100 of FIG. 4, the first power supply voltage may be approximately ground, and a second power supply voltage may be higher than the first power supply voltage and may be used for precharging purposes (e.g. for precharging read bit lines 103-106 of FIG. 4).

Note that circuit 100 of FIG. 4 will be replicated for each additional bit in an address (e.g. address0). In addition, circuit 100 will also be replicated for each bit0 in an address from address0 to addressN. For example, bit0 of address1 will utilize a replication of circuit 100.

There are many benefits to the particular embodiment shown in circuit 100 of FIG. 4 other than those previously mentioned. Those skilled in the art will notice that by sharing write bit lines (101 and 102), and not duplicating them for each storage circuit (180-183), routing is reduced. This allows greater spacing of the read bit lines (103-106) to reduce parasitic capacitances and it also allows widening of the read bit lines (103-106) to reduce the parasitic resistances of the conductors. Either of these benefits may allow for faster read operation of circuit 100. In addition, the embodiment shown in circuit 100 has fewer write bit lines (101 and 102) than other applications using storage elements, and thus requires less circuitry to drive the write bit lines (101 and 102). This means a smaller circuit may be used and there are fewer devices which may suffer from parasitic power consumption. Thus, less semiconductor area may be required, and less leakage current may result.

One embodiment of read operation for circuit 100 of FIG. 4 will now be described. In one embodiment, during a read operation to address0, the read word line 107 is asserted, thus making transistors 132, 133, 134, and 135 conducting. The transistors 136, 137, 138, and 139 are either conducting or non-conducting based on the value stored in storage cells 112, 113, 114, and 115, respectively. When transistor 136 is conducting, the precharged read bit line (way0) 103 is discharged from a logic level "1" to a logic level "0". When transistor 137 is non-conducting, the precharged read bit line (way1) 104 is not discharged to logic level "0". The read bit line (way2) 105 and the read bit line (way3) 106 are either discharged or not discharged depending upon whether transistors 138 and 139 are conducting or non-conducting. Note that in the illustrated embodiment, all the ways (ways0-3) are read concurrently.

One embodiment of write operation for circuit 100 of FIG. 4 will now be described. In one embodiment, during a write operation, only one way is written at a time. For example, for a write access to address0 of way0, the write word line (way0) 108 is asserted and all other write word lines 109-111 are not asserted. The data to be written is applied or provided to the write bit line 101 and the complementary data is applied or provided to write bit line bar 102. When the write word line (way0) 108 is asserted, the transistors 124 and 125 become conducting. This couples the two terminals of storage cell 112 to write bit line 101 and write bit line bar 102, respectively, in order to transfer the write data value to the storage cell 112.

Note that for the illustrated embodiment, the read access and the write access are independent of each other. Thus, a read operation and a write operation can occur concurrently provided that the read access is to a different address than the write access. So for the illustrated embodiment, a read access and a write access to different addresses can occur concurrently, partially overlapping, or non-overlapping in time.

Note that alternate embodiments of the present invention may add additional read and/or write ports by adding a small amount of circuitry. For example, additional read ports may be added by adding extra transistors in parallel with transistors 132 and 136, 133 and 137, 134 and 138, and 135 and 139 for each way, and also adding extra read word lines and extra read bit lines. Additional write ports may be added by adding extra transistors in parallel with transistors 124 and 125, 126 and 127, 128 and 129, and 130 and 131 for each way, and also adding extra write word lines and extra write bit lines.

Figure 5:
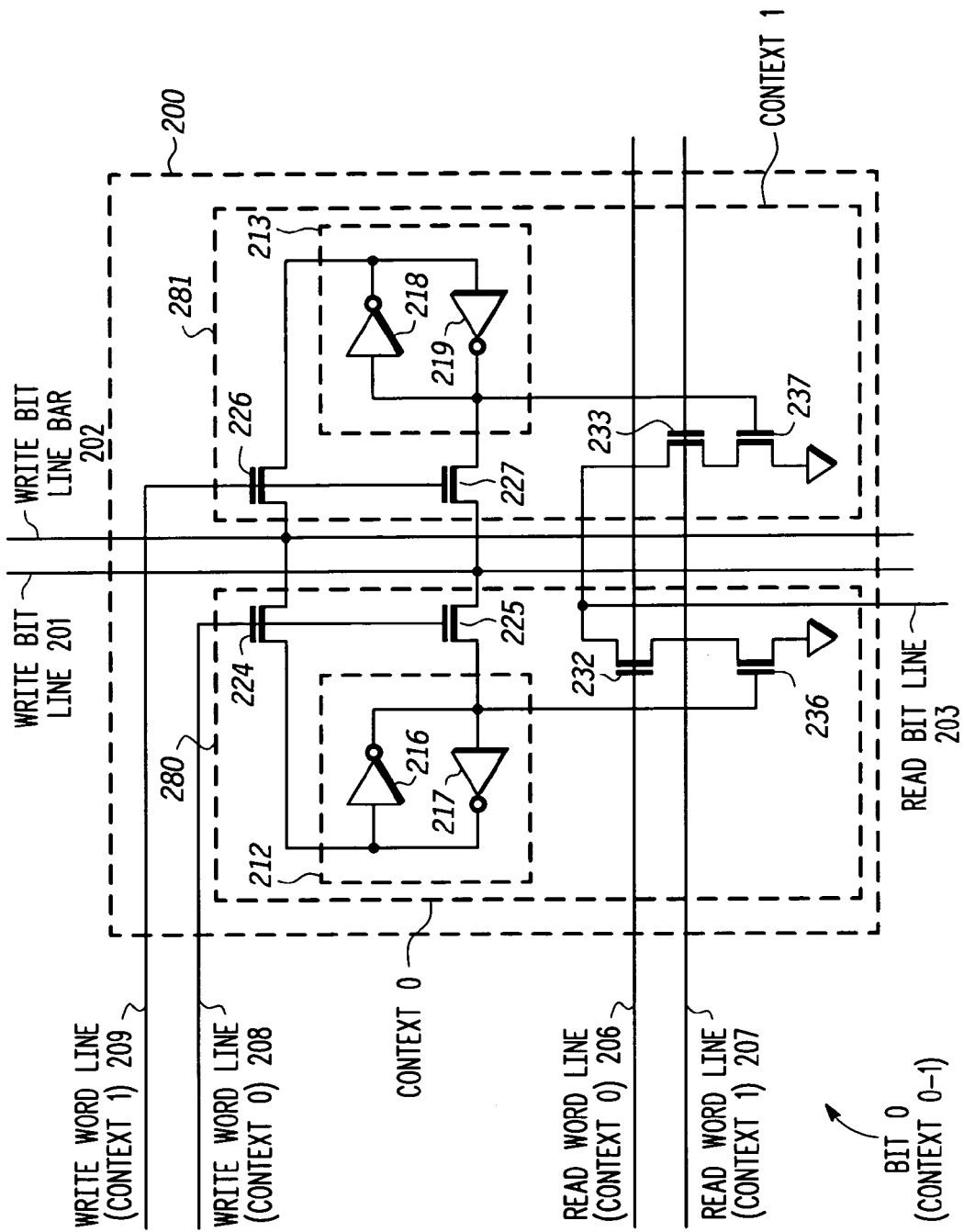
FIG. 5 illustrates, in schematic diagram form, bit0 of address0 of a portion of register file 17 of FIG. 1 in accordance with one embodiment of the present invention.

Referring now to FIG. 5, although the circuit 200 of FIG. 5 may also be used in the context of a cache 18, it will be described in the context of a register file (e.g. register file 17 of FIG. 1). Thus, in place of the concept of "ways" which is used in caches, the concept of "contexts" will be used. For example, register file 17 may be used for context switching, such as when multiple tasks or threads are used. Note that the present invention may be used in any desired application, and that the applications described herein (e.g. cache ways, context switching) are just two possible applications. In addition, the circuits described herein in FIGS. 4 and 5 may be used in any portion of data processing system 10, such as, for example, in register file 17, in branch unit 15 (e.g. for storing potential branch addresses), in SRAM 19, in other modules 20, in cache 18, in buffer 21, and in memory 14. Alternate embodiments may use the circuits illustrated in FIGS. 4-5 in any desired manner and for any desired applications.

FIG. 5 illustrates one embodiment of circuit 200 (bit0 of address0 for contexts0-1) of a portion of register file 17 of FIG. 1. The storage cell 212 for context0 comprises cross-coupled inverters 216 and 217. Storage cell 212 has a first terminal coupled to a first current electrode of transistor 224 and a second terminal coupled to a first current electrode of transistor 225. The control electrode of transistors 224 and 225 are both coupled to write word line (context0) 208. The second terminal of storage cell 212 is coupled to a control electrode of transistor 236. A first current electrode of transistor 236 is coupled to a first power supply voltage. A second current electrode of transistor 236 is coupled to a first current electrode of transistor 232. Read word line 206 is coupled to a control electrode of transistor 232. A second current electrode of transistor 232 is coupled to read bit line 203.

The storage cell 213 for context1 comprises cross-coupled inverters 218 and 219. Storage cell 213 has a first terminal coupled to a first current electrode of transistor 226 and a second terminal coupled to a first current electrode of transistor 227. The control electrode of transistors 226 and 227 are both coupled to write word line (context1) 209. A second current electrode of transistor 226 is coupled to a second current electrode of transistor 224 and to write bit line bar 202. A second current electrode of transistor 227 is coupled to a second current electrode of transistor 225 and to write bit line 201. The second terminal of storage cell 213 is coupled to a control electrode of transistor 237. A first current electrode of transistor 237 is coupled to the first power supply voltage. A second current electrode of transistor 237 is coupled to a first current electrode of transistor 233. Read word line 207 is coupled to a control electrode of transistor 233. A second current electrode of transistor 233 is coupled to read bit line 203. Circuitry 280 is used for context0, and circuitry 281 is used for context1. The transistors illustrated in FIG. 5 are all n-channel field effect transistors. Alternate embodiments may instead use p-channel field effect transistors or a combination of n-channel and p-channel transistors coupled appropriately within circuit 200.

For some embodiments of circuit 200 of FIG. 5, the first power supply voltage may be approximately ground, and a second power supply voltage may be higher than the first power supply voltage and may be used for precharging purposes (e.g. for precharging read bit line 203 of FIG. 5).

Note that circuit 200 of FIG. 5 will be replicated for each additional bit in an address (e.g. address0). In addition, circuit 200 will also be replicated for each bit0 in an address from address0 to addressN. For example, bit0 of address1 will utilize a replication of circuit 200.

The circuit illustrated in FIG. 5 may be applicable for use in a two-threaded register file (e.g. register file 17 of FIG. 1) with a single read port and a single write port. Each thread (or equivalently "context") is represented by a distinct storage element 212, 213. At a given time, the register file 17 access will take place on one of the two threads. For example, a write operation to this particular bit entails a logic level "1" on the appropriate write word line (208 or 209). The non-accessed thread will have its write word line at a logic level "0". The data values present on write bit lines 201 and 202 are then coupled into the appropriate storage cell 212 and 213 through the respective select transistors (224 and 225, 226 and 227).

One embodiment of read operation for circuit 200 of FIG. 5 will now be described. In the illustrated embodiment, a read access requires that appropriate read word line (206 or 207) to be at a logic level "1". In one embodiment, during a read operation for context0, the read word line 206 is asserted (i.e. logic level "1"), thus making transistor 232 conducting and transistor 233 substantially non-conducting. As a result, the value stored in storage cell 212 will now determine the resultant value of read bit line 203. In one embodiment, read bit line 203 was initially precharged to a logic level "1". Read bit line 203 will either discharge to a logic level "0", or will remain precharged at a logic level "1". In one embodiment, the value of the read bit line 203 may be coupled to a register file 17 data output bus (not shown) through either an inverter or a buffer (not shown). Note that for the preceding read operation, the value stored in storage cell 213 has an insignificant impact on read bit line 203 due to the fact that transistor 233 is substantially non-conductive.

The preceding description of FIG. 5 specifically applies to the case of a single read port and a single write port. However, the circuitry illustrated in FIG. 5 may be easily extended to the case of multiple read ports and/or multiple write ports. In the illustrated embodiment of FIG. 5, adding read ports entails the addition of read word lines (such as 206, 207) and the addition of read bit lines (such as 203) that are each connected to an n-channel series stack (similar to stack 236, 232 and stack 233, 237). Adding write ports entails the addition of write word lines (such as 208, 209) and write bit lines (such as 201,202) that are each connected to select transistors (such as 224, 225 and 226, 227).

In the foregoing specification, the invention has been described with reference to specific embodiments. However, one of ordinary skill in the art appreciates that various modifications and changes can be made without departing from the scope of the present invention as set forth in the claims below. For example, read and/or write bit lines may be single-ended bit lines or may alternately be bit line pairs. There are multiple possibilities for bit line pairs. For example, bit line pairs may be precharged high, precharged low, precharged to a value between ground and VDD, carry small-signal differential voltages, or carry full rail complimentary voltages. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. The terms a or an, as used herein, are defined as one or more than one. The terms including and/or having, as used herein, are defined as comprising (i.e., open language). As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A storage circuit comprising:
a first storage cell having a first terminal and a second terminal for storing a first data value;
a second storage cell having a first terminal and a second terminal for storing a second data value;
a shared write bit line coupled to each of the first storage cell and the second storage cell for selectively providing both the first data value and the second data value to the first storage cell and the second storage cell, respectively,
wherein the first data value and the second data value are non-concurrently writable;
a first read bit line coupled to the first storage cell for selectively reading only the first storage cell; and
a second read bit line coupled to the second storage cell for selectively reading only the second storage cell.

2. The storage circuit of claim 1 further comprising:
a shared read word line for selectively enabling reading each of the first storage cell and second storage cell in response to a shared read signal.

3. The storage circuit of claim 1 wherein the first storage cell and the second storage cell each comprise one of a static random access memory (SRAM) cell, a register, a cache tag array memory cell, a buffer or a branch unit memory cell.

4. The storage circuit of claim 1 further comprising:
a first select gate coupled to the first terminal of the first storage cell;
a second select gate coupled to the second terminal of the second storage cell;
a first write word line coupled to the first select gate, the first write word line enabling the first select gate to write the first storage cell;
a second write word line coupled to the second select gate, the second write word line enabling the second select gate to write the second storage cell.

5. The storage circuit of claim 4 further comprising:
a third select gate coupled to the second terminal of the first storage cell, the third select gate being controlled by the first write word line; and
a fourth select gate coupled to the first terminal of the second storage cell, the fourth select gate being controlled by the second write word line.

6. The storage circuit of claim 1 wherein the first storage cell is assigned to a first way of an associative memory and the second storage cell is assigned to a second way of the associative memory.

7. A storage circuit comprising:
a first storage cell having a first terminal and a second terminal for storing a first data value;
a second storage cell having a first terminal and a second terminal for storing a second data value;
a first write word line coupled to the first storage cell for selectively writing to only the first storage cell;
a second write word line coupled to the second storage cell for selectively writing to only the second storage cell;
a first select gate coupled to the first storage cell and a second select gate coupled to the second storage cell;
a shared read word line coupled to each of the first select gate and the second select gate for selectively providing a control signal to provide both the first data value and the second data value from the first storage cell and the second storage cell, respectively.

8. The storage circuit of claim 7 further comprising:
a shared write bit line coupled to each of the first storage cell and the second storage cell for selectively providing both the first data value and the second data value to the first storage cell and the second storage cell, respectively.

9. A storage circuit comprising:
a first storage cell having a first terminal and a second terminal for storing a first data value;
a second storage cell having a first terminal and a second terminal for storing a second data value;
a shared write bit line coupled to each of the first storage cell and the second storage cell for selectively providing both the first data value and the second data value to the first storage cell and the second storage cell, respectively;
a first read select gate for selectively enabling reading the first storage cell and a second read select gate for selectively enabling reading the second storage cell; and
a shared read bit line coupled to each of the first read select gate and the second read select gate for selectively reading each of the first storage cell and the second storage cell.

10. The storage circuit of claim 9 wherein at least one of the shared write bit line and the shared read bit line further comprises a complementary bit line selectively affecting or affected by one of the first terminal or the second terminal of the first storage cell and the second storage.

11. The storage circuit of claim 9 further comprising:
a first write word line coupled to the first storage cell and a second write word line coupled to the second storage cell for selectively separately writing the first storage cell and the second storage cell; and
a first read word line coupled to the first storage cell and a second read word line coupled to the second storage cell for selectively separately reading the first storage cell and the second storage cell.

12. A storage circuit comprising:
a first storage cell having a first terminal and a second terminal for storing a first data value;
a second storage cell having a first terminal and a second terminal for storing a second data value;
a shared write bit line coupled to each of the first storage cell and the second storage cell for selectively providing both the first data value and the second data value to the first storage cell and the second storage cell, respectively;
a first read bit line coupled to the first storage cell for selectively reading only the first storage cell;
a second read bit line coupled to the second storage cell for selectively reading only the second storage cell;

a first select gate coupled to the first terminal of the first storage cell;

a second select gate coupled to the second terminal of the second storage cell;

a first write word line coupled to the first select gate, the first write word line enabling the first select gate to write the first storage cell; and a second write word line coupled to the second select gate, the second write word line enabling the second select gate to write the second storage cell.

13. A storage circuit comprising:

a first storage cell having a first terminal and a second terminal for storing a first data value;

a second storage cell having a first terminal and a second terminal for storing a second data value;

a shared write bit line coupled to each of the first storage cell and the second storage cell for selectively providing both the first data value and the second data value to the first storage cell and the second storage cell, respectively;

a first read bit line coupled to the first storage cell for selectively reading only the first storage cell;

a second read bit line coupled to the second storage cell for selectively reading only the second storage cell;

a first select gate coupled to the first terminal of the first storage cell;

a second select gate coupled to the second terminal of the second storage cell;

a first write word line coupled to the first select gate, the first write word line enabling the first select gate to write the first storage cell;

a second write word line coupled to the second select gate, the second write word line enabling the second select gate to write the second storage cell;

a third select gate coupled to the second terminal of the first storage cell, the third select gate being controlled by the first write word line; and a fourth select gate coupled to the first terminal of the second storage cell, the fourth select gate being controlled by the second write word line.

* * * * *